(12) United States Patent
Li et al.

(10) Patent No.: US 8,861,070 B2
(45) Date of Patent: Oct. 14, 2014

(54) ELECTRONIC PAPER DISPLAY SUBSTRATE AND THE MANUFACTURING METHOD THEREOF

(75) Inventors: Wenbo Li, Beijing (CN); Yanbing Wu, Beijing (CN); Libo Wang, Beijing (CN); Gang Wang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 148 days.

(21) Appl. No.: 13/316,713

(22) Filed: Dec. 12, 2011

(65) Prior Publication Data

US 2012/0147453 A1 Jun. 14, 2012

(30) Foreign Application Priority Data

Dec. 13, 2010 (CN) .......................... 2010 1 0600980

(51) Int. Cl.
*G02B 26/00* (2006.01)
*G02F 1/1362* (2006.01)
*H01L 27/12* (2006.01)
*G02F 1/1334* (2006.01)

(52) U.S. Cl.
CPC ........... *G02F 1/1362* (2013.01); *H01L 27/1214* (2013.01); *G02F 1/1334* (2013.01); *G02F 2001/136222* (2013.01)
USPC .......................................... 359/296; 359/290

(58) Field of Classification Search
USPC .......................................... 359/238, 290, 296
See application file for complete search history.

(56) References Cited

U.S. PATENT DOCUMENTS

| | | | |
|---|---|---|---|
| 8,300,297 B2* | 10/2012 | Noh et al. | 359/266 |
| 2007/0133080 A1* | 6/2007 | Shikina et al. | 359/296 |
| 2008/0218645 A1 | 9/2008 | Zhu et al. | |
| 2009/0128753 A1 | 5/2009 | Shi | |
| 2009/0244689 A1* | 10/2009 | Lin | 359/296 |
| 2010/0149629 A1* | 6/2010 | Seo et al. | 359/296 |
| 2010/0295049 A1 | 11/2010 | Yoo et al. | |
| 2011/0176197 A1* | 7/2011 | Noh et al. | 359/296 |

FOREIGN PATENT DOCUMENTS

| | | |
|---|---|---|
| CN | 101266374 A | 9/2008 |
| CN | 101324733 A | 12/2008 |
| CN | 101425482 A | 5/2009 |
| CN | 101435961 A | 5/2009 |
| CN | 101894807 A | 11/2010 |

OTHER PUBLICATIONS

First Chinese Office Action dated Dec. 4, 2013; Appln. No. 201010600980.0.
Second Chinese Office Action dated Jul. 2, 2014; Appln. No. 201010600980.0.

* cited by examiner

*Primary Examiner* — Mahidere Sahle
(74) *Attorney, Agent, or Firm* — Ladas & Parry LLP

(57) ABSTRACT

By forming a corresponding colored layer under the pixel electrode having a predetermined pattern of the electronic paper display substrate, the pattern displayed in the region where the pixel electrode and the colored layer is disposed has the color of the colored layer when displaying. Compared with the transparency color, the color of the colored layer can make the contrast of the pixel region to the non-pixel region high and display colorful pattern.

20 Claims, 4 Drawing Sheets

ELECTRONIC PAPER DISPLAY SUBSTRATE AND THE MANUFACTURING METHOD THEREOF

TECHNICAL FIELD

Embodiments of the present disclosure relates to an electronic paper display substrate, a manufacturing method thereof, and an electronic paper display.

BACKGROUND

Electronic paper displays include an electronic paper display with a predetermined pattern. In such electronic paper display with predetermined pattern, an upper substrate includes a base substrate and a common electrode formed on the base substrate, and a lower substrate generally includes a base substrate and a pixel electrode with predetermined pattern formed on the base substrate. Display medium may be filled between the upper substrate and the lower substrate. The display medium may be electro chromism (EC) material or polymer dispersed liquid crystal (PDLC) material.

EC material may generate a reversible change between chromatic state of low transmittance and achromatic state of high transmittance by injecting or drawing charges (ions or electrons) under the effect of alternate high and low external field or alternate positive and negative external field. This is a special phenomenon that the physical performance of material is changed due to the electrochemical change, and exhibit a reversible change between specific color state and transparent state in terms of display state. Electro chromism material can achieve bi-stable state and requires a low driving voltage. A PDLC film can present two different optical states of transmission and dispersion under the effect of external field, such as, alternating current field, heat field, and so on. For example, the PDLC film presents dispersion state when electric field is not applied to the PDLC film, so that the region in the electronic paper display without electric field presents milk white. PDLC film presents transparent state when electric field is applied to the PDLC film, and the region in the electronic paper display applied with the electric filed presents transparent. Since the PDLC film does not need polarization sheet, rubbing alignment is not needed and large size flexible display is possible, thus the process is greatly simplified and the luminance and performance of the display is improved. Therefore, the above-mentioned EC material and PDLC film may be applied to electronic paper display, especially to such electronic paper display with predetermined pattern.

However, in the conventional electronic paper display, a pattern displayed in the pixel region has poor contrast with the non-pixel region, and color of the pattern is monotonic. For example, when the display medium is PDLC film, the pattern displayed in the pixel region is transparent, and the pattern in the non-pixel region is milk white. Furthermore, in the conventional electronic paper display, fringe field between the pixel electrode of the lower substrate and the common electrode of the upper substrate has prominent influence on the display medium and deteriorates the display quality.

SUMMARY

Embodiments of the present disclosure provide an electronic paper display substrate and the manufacturing method thereof and an electronic paper display so as to improve the contrast of the pixel region to the non-pixel region of the electronic paper display.

An embodiment of the present disclosure provides a manufacturing method of an electronic paper display substrate, comprising forming a color pixel electrode having a predetermined pattern on a base substrate.

An embodiment of the present disclosure provides a manufacturing method of an electronic paper display substrate, comprising: forming a colored layer thin film and a transparent conductive thin film on a base substrate; and forming a pixel electrode and a colored layer having a predetermined pattern by patterning process.

Furthermore, in order to weaken the interference to the display medium by the fringe field between the common electrode and the pixel electrode, in the manufacturing method of the electronic paper display substrate, the step of forming the colored layer thin film and the transparent conductive thin film on the base substrate comprises: forming an equipotential conductive thin film covering the entire base substrate on the base substrate; forming a colored insulating layer thin film as the colored layer thin film on the equipotential conductive thin film; and forming the transparent conductive thin film on the colored insulating layer thin film.

The equipotential conductive thin film may be connected with the common electrode on the upper substrate to form an equipotential, so that there is no electric field between the non-pixel region and the common electrode. Thus, the display medium on the non-pixel region does not change and the influence to the display medium by the fringe field between the common electrode and the pixel electrode is weakened.

Another embodiment of the present disclosure further provides a manufacturing method of an electronic paper display substrate, comprising: forming a colored conductive thin film on a base substrate; and forming a color pixel electrode having a predetermined pattern by patterning process.

Another embodiment of the present disclosure further provides a manufacturing method of an electronic paper display substrate, comprising: forming a gate line, a data line and a gate electrode, a source electrode, a drain electrode and an active layer of a thin film transistor on a base substrate, wherein pixel units are formed to be surrounded by the data line and the gate line, each pixel unit comprises a thin film transistor and a pixel electrode, the gate electrode connects with the gate line, the source electrode connects with the data line, the drain electrode connects with the pixel electrode, and the active layer is formed between the source and drain electrodes and the gate electrode; and forming a colored layer on the base substrate.

Another embodiment of the present disclosure further provides an electronic paper display substrate comprising a base substrate, and a pixel electrode formed on the base substrate, wherein the base substrate further comprises a colored layer corresponding to the pixel electrode.

Furthermore, in order to weaken the interference to the display medium by the fringe field between the common electrode and the pixel electrode, an equipotential conductive thin film covering the entire base substrate is formed under the colored layer of the electronic paper display substrate. The equipotential conductive thin film is formed of transparent conductive material or opaque conductive material.

The equipotential conductive thin film may be connected with the common electrode to form an equipotential, so that there is no electric field between the non-pixel region and the common electrode. Thus, the display medium on the non-pixel region does not change and the influence to the display medium by the fringe field between the common electrode and the pixel electrode is weakened.

Another embodiment of the present disclosure further provides an electronic paper substrate comprising a base substrate, wherein a color pixel electrode is formed on the base substrate.

Another embodiment of the present disclosure further provides an electronic paper display comprising an upper substrate and a lower substrate cell assembled together, wherein a transparent conductive thin film is formed on a surface of the upper substrate facing the lower substrate, the lower substrate is the above described electronic paper display substrate, and display medium is interposed between the upper substrate and the lower substrate.

In the electronic paper display substrate and manufacturing method and electronic paper display according to the embodiments of the present disclosure, by forming a corresponding colored layer under the pixel electrode having a predetermined pattern of the electronic paper display substrate, pattern displayed by the region where the pixel electrode and the colored layer are disposed is of the color of the colored layer when the electronic paper display is electrified and displays. Compared with the transparent color, the color of the colored layer may improve the contrast of the pixel region to the non-pixel region and display colorful pattern.

BRIEF DESCRIPTION OF THE DRAWINGS

The embodiments of the present disclosure will become more fully understood from the detailed description given hereinafter and the accompanying drawings which are given by way of illustration only, and thus are not limitative of the present disclosure and wherein.

DETAILED DESCRIPTION

Solutions of the embodiments of the present disclosure will be described clearly and completely hereafter with accompany of the attached drawings in order to make the objection, technical solutions and advantages of the embodiments of the present disclosure more clear. It is obvious that only some of the embodiments, not all of the embodiments, are described. Based on the embodiments of the present disclosure, all other embodiments obtained by those skilled in the art without any inventive labor are intended to be included within the scope of the present disclosure defined by the claims.

Embodiment 1

The manufacturing method of the electronic paper display substrate according to the first embodiment comprises the following steps.

Step 101: forming a colored layer thin film and a transparent conductive thin film on the base substrate; and Step 102: forming a pixel electrode and a colored layer having a predetermined pattern by patterning process.

Figure 1A:
FIG. 1A is a schematic structural side view after deposition in the manufacturing method of the electronic paper display substrate according to embodiment 1 of the present disclosure.
Figure 1B:
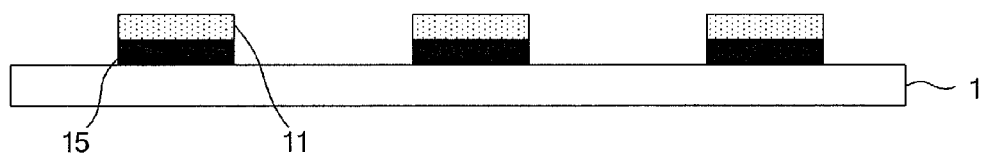
FIG. 1B is a schematic structural side view after etching in the manufacturing method of the electronic paper display substrate according to embodiment 1 of the present disclosure.
Figure 1C:
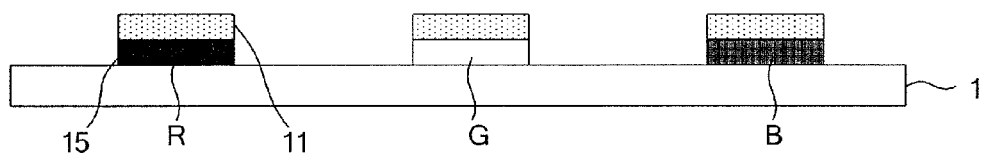
FIG. 1C is a schematic structural side view showing the case in which the colored layer is a color film layer in the manufacturing method of the electronic paper display substrate according to embodiment 1 of the present disclosure.

FIG. 1A is a schematic structural side view after deposition in the manufacturing method of the electronic paper display substrate according to embodiment 1 of the present disclosure, and FIG. 1B is a schematic structural side view after etching in the manufacturing method of the electronic paper display substrate according to embodiment 1 of the present disclosure. As shown in FIGS. 1A and 1B, a colored layer thin film 13 for forming the colored layer by etching and a transparent conductive thin film 14 for forming the pixel electrode by etching are formed on the base substrate 1. Then, a photoresist is coated on the transparent conductive thin film 14, exposure and developing are performed on the photoresist by using single-tone mask plate to form a photoresist completely remained region and a photoresist completely removed region. By etching the transparent conductive thin film 14 and the colored layer thin film 13 corresponding to the photoresist completely removed region, the pixel electrode 11 and the colored layer 15 having a predetermined pattern may be formed. The pattern of the pixel electrode 11 and the pattern of the colored layer 15 may be identical with each other and the colored layer 15 may be under the pixel electrode 11. The colored layer thin film preferably is a material absorbing light. For example, the colored layer thin film may be colored conductive material such as black metal material chromium, or colored insulating material such as the material of the black resin matrix BM in the TFT-LCD color filter, and so on. The color of the colored layer 15 is not limited to black, and it may be red, green or other colors, which may be achieved by a material film layer with specific color or color filter, and so on. When electrifying, after light in the pixel region where the pixel electrode 11 and the colored layer 15 are formed enters from the display medium such as PDLC film, since the PDLC film is applied with an electric field, the PDLC film corresponding to the pixel region where the pixel electrode 11 is formed is transparent, and light presents the color of the colored layer. For example, when the colored layer is black, when electrifying, the pixel region where the pixel electrode and the colored layer are formed presents black. Furthermore, the colored layer 15 may also be a color film layer comprising a plurality of RGB units. FIG. 1C is a schematic structural side view showing the case in which the colored layer is a color film layer in the manufacturing method of the electronic paper display substrate according to embodiment 1 of the present disclosure. As shown in FIG. 1C, the pixel region on the base substrate 1 of the electronic paper display substrate may include a plurality of pixel electrodes 11 with relatively small size. The colored layer 15 under each pixel electrode 11 may be one of R, G, and B units. When electrifying, after light is incident to each pixel electrode 11 and the underlying colored layer 15 of the pixel region from the display medium, the R, G or B unit of the colored layer 15 under each pixel electrode 11 absorbs the corresponding light, so that the pixel region where the pixel electrode and the colored layer are formed display color pattern synthetically.

According to the present embodiment, by forming a corresponding colored layer under the pixel electrode having a predetermined pattern of the electronic paper display substrate, when electrifying and displaying, pattern displayed in the region where the pixel electrode and the colored layer are disposed is the pattern of the colored layer and has the same color as that of the colored layer. Compared with the transparent color, the color of the colored layer can make the contrast of the pixel region to the non-pixel region high and display colorful pattern.

Embodiment 2

Figure 2A:
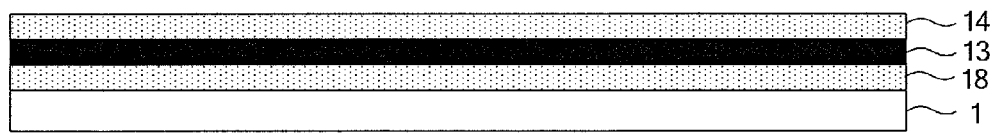
FIG. 2A is a schematic structural side view after deposition in the manufacturing method of the electronic paper display substrate according to embodiment 2 of the present disclosure.
Figure 2B:
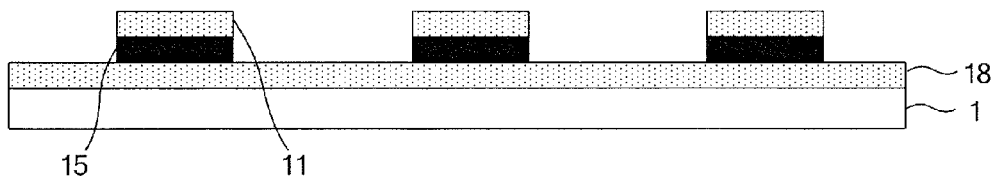
FIG. 2B is a schematic structural side view after etching in the manufacturing method of the electronic paper display substrate according to embodiment 2 of the present disclosure.

FIG. 2A is a schematic structural side view after deposition in the manufacturing method of the electronic paper display substrate according to embodiment 2 of the present disclosure, and FIG. 2B is a schematic structural side view after etching in the manufacturing method of the electronic paper display substrate according to embodiment 2 of the present disclosure. The manufacturing method of the electronic paper display substrate of the second embodiment of the present disclosure comprises the following steps.

Step 201: forming an equipotential conductive thin film 18 covering the entire base substrate on the base substrate 1, referring to FIG. 2A;

Step 202: forming a colored insulating layer thin film as the colored layer thin film 13 on the equipotential conductive thin film 18, referring to FIG. 2A;

Step 203: forming a transparent conductive thin film 14 on the colored insulating layer thin film, referring to FIG. 2A; and Step 204: forming a pixel electrode 11 and a colored layer 15 having a predetermined pattern by patterning process, referring to FIG. 2B.

As shown in FIGS. 2A and 2B, the equipotential conductive thin film 18 may be deposited on the base substrate 1 by sputtering method. The equipotential conductive thin film 18 may be formed of material such as Indium Tin Oxides (ITO) or other colored metals. Then, since the equipotential conductive thin film is conductive material, if it is necessary to make the pixel electrode to be insulated from the equipotential conductive thin film, a colored insulating layer thin film such as black resin thin film may be spin coated on the base substrate 1, where the equipotential conductive thin film 18 is formed, by spin coating method as the colored layer thin film 13. A transparent conductive thin film 14 such as ITO thin film may be deposited on the colored insulating layer thin film by sputtering method. If the colored layer thin film does not adopts insulating material, an insulating layer may be added between the colored layer thin film and the equipotential conductive thin film. In the step 204 of the present embodiment, the process of forming pixel electrode and colored layer having a predetermined pattern by patterning process may comprise:

Step 301: coating a photoresist on the transparent conductive thin film 14;

Step 302: performing exposure and developing on the photoresist by using single-tone mask plate to form a photoresist completely remained region and a photoresist completely removed region, wherein the photoresist completely remained region corresponds to a pixel electrode region and the photoresist completely removed region corresponds to the region other than the pixel electrode region;

Step 303: removing the transparent conductive thin film 14 corresponding to the photoresist completely removed region by etching to form a pattern including the pixel electrode 11, wherein the etching may be wet etching.

Step 304: removing the colored layer thin film 13 corresponding to the photoresist completely removed region by etching to form a pattern including the colored layer 15, wherein the etching may be dry etching.

Step 305: removing the remained photoresist by ashing.

In the present embodiment, the pattern of the pixel electrode 11 and the pattern of the colored layer 15 may be identical with each other, and the colored layer 15 may locate under the pixel electrode 11. In the present embodiment, the colored layer 15 is an insulating layer, and the optical density (OD) of the material of the colored layer 15 is preferably larger than 3. There is no limitation on the transmittance of the equipotential conductive thin film 18. The equipotential conductive thin film 18 may be formed of transparent ITO or other colored metals. The color of the colored layer may be referred to the related description in the embodiment 1.

In addition, the region in which the equipotential conductive thin film 18 is disposed is non-pixel region. The equipotential conductive thin film 18 connects with the common electrode of the upper substrate and may connect with the common electrode of the upper substrate at periphery by anisotropic conductive silver adhesive and so on and form the same potential with the common electrode.

According to the present embodiment, by forming a corresponding colored layer under the pixel electrode having a predetermined pattern of the electronic paper display substrate, when electrifying and displaying, pattern displayed in region where the pixel electrode and the colored layer are disposed is the color of the colored layer. Compared with the transparent color, the color of the colored layer can make the contrast of the pixel region to the non-pixel region high and display colorful pattern. The equipotential conductive thin film of the electronic paper display substrate can form the same potential with the common electrode of the upper substrate so as to weaken the interference to the display medium on the non-pixel region by the fringe field between the common electrode and the pixel electrode and to improve the display quality.

Embodiment 3

The manufacturing method of the electronic paper display substrate according to embodiment 3 of the present disclosure comprises the following steps:

Step 401: forming a colored conductive thin film on the base substrate, wherein the colored conductive thin film may be formed by depositing colored conductive thin film such as black metals by sputtering method.

Step 402: forming a color pixel electrode having a predetermined pattern by patterning process, and this step can be divided into the following cases.

Figure 3A:
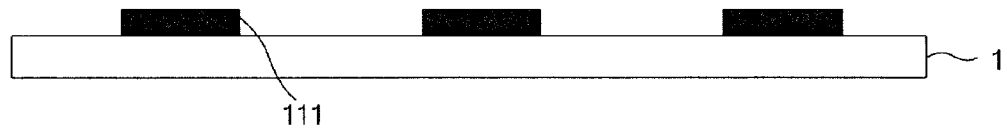
FIG. 3A is a schematic structural side view of the electronic paper display substrate showing the first case in the manufacturing method of the electronic paper display substrate according to embodiment 3 of the present disclosure.

In the first case, the pixel electrode may be formed of a layer of colored conductive thin film. FIG. 3A is a schematic structural side view of the electronic paper display substrate showing the first case in the manufacturing method of the electronic paper display substrate according to embodiment 3 of the present disclosure. The step 402 can comprise:

Step 501: coating photoresist on the colored conductive thin film;

Step 502: performing exposure and developing on the photoresist by patterning process using single-tone mask plate to form a photoresist completely remained region and a photoresist completely removed region, wherein the photoresist completely remained region corresponds to a color pixel electrode region and the photoresist completely removed region corresponds to region other than the color pixel electrode region;

Step 503: removing the colored conductive thin film corresponding to the photoresist completely removed region by etching to form a pattern including the color pixel electrode 111;

Step 504: removing the remained photoresist by ashing.

Figure 3B:
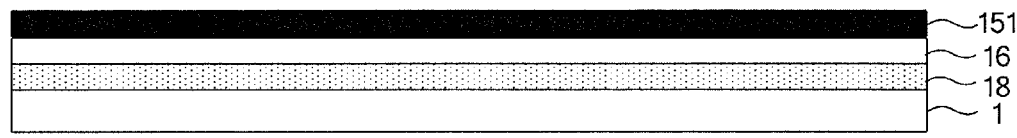
FIG. 3B is a schematic view showing the structure after deposition in the second case of the manufacturing method of the electronic paper display substrate according to embodiment 3 of the present disclosure.
Figure 3C:
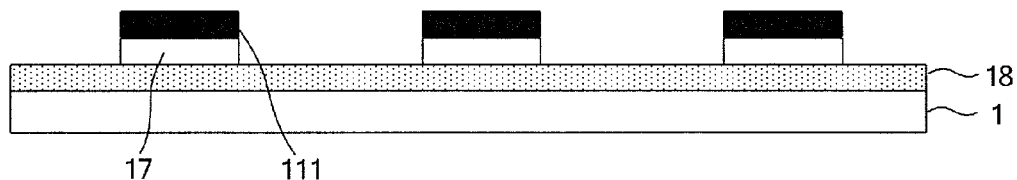
FIG. 3C is a schematic structural side view of the electronic paper display substrate showing the second case in the manufacturing method of the electronic paper display substrate according to embodiment 3 of the present disclosure.

In the second case, the electronic paper display substrate further comprises an equipotential conductive thin film 18. FIG. 3B is a schematic view showing the structure after deposition in the second case of the manufacturing method of the electronic paper display substrate according to embodiment 3 of the present disclosure. In this case, before step 401, there is a step of sequentially forming the equipotential conductive thin film 18 and the insulating layer thin film 16 on the base substrate 1. The insulating layer thin film 16 can be deposited by PECVD method. Then, when performing step 401, a colored conductive thin film 151 is deposited on the insulating layer thin film 16. Therefore, in this case, the colored conductive thin film 151 and the insulating layer thin film 16 need to be etched in step 402. FIG. 3C is a schematic structural side view of the electronic paper display substrate showing the second case in the manufacturing method of the electronic paper display substrate according to embodiment 3 of the present disclosure. As shown in FIGS. 3B and 3C, in the second case, step 402 may comprise:

Step 601: coating a photoresist on the colored conductive thin film 151;

Step 602: performing exposure and developing on the photoresist by patterning process using single-tone mask plate to form a photoresist completely remained region and a photoresist completely removed region, wherein the photoresist completely remained region corresponds to a color pixel electrode region and the photoresist completely removed region corresponds to the region other than the color pixel electrode region;

Step 603: removing the colored conductive thin film 151 and the insulating layer thin film 16 corresponding to the photoresist completely removed region by etching to form a pattern including the color pixel electrode 111, wherein an insulating layer 17 is between the color pixel electrode 111 and the equipotential conductive thin film 18, and the insulating layer thin film may be etched by dry etching method.

Step 604: removing the remained photoresist by ashing.

Figure 3D:
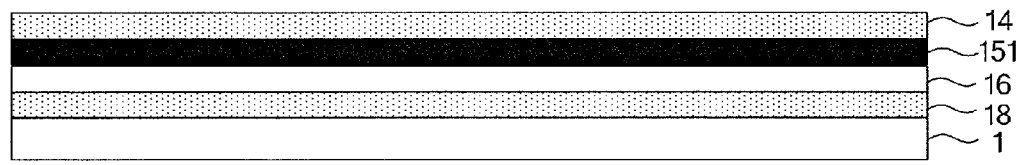
FIG. 3D is a schematic view showing the structure after deposition in the third case of the manufacturing method of the electronic paper display substrate according to embodiment 3 of the present disclosure
Figure 3E:
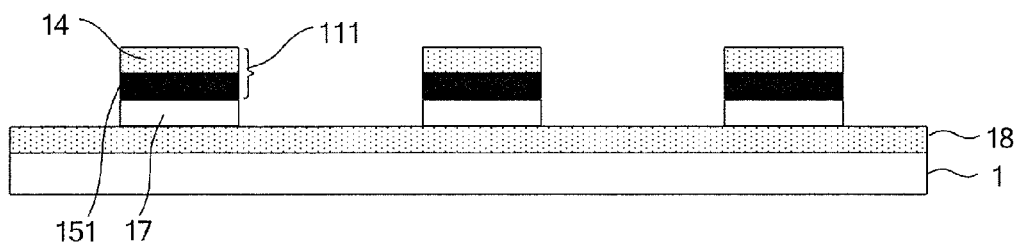
FIG. 3E is a schematic structural side view of the electronic paper display substrate showing the third case in the manufacturing method of the electronic paper display substrate according to embodiment 3 of the present disclosure.

In the third case, the color pixel electrode may be formed of a colored conductive thin film and a transparent conductive thin film. In this case, between step 401 and 402, there is a step of forming a transparent conductive thin film. The transparent conductive thin film may be positioned on the colored conductive thin film or under the colored conductive thin film. The case of forming the transparent conductive thin film on the colored conductive thin film is taken as an example herein. FIG. 3D is a schematic view showing the structure after deposition in the third case of the manufacturing method of the electronic paper display substrate according to embodiment 3 of the present disclosure, FIG. 3E is a schematic structural side view of the electronic paper display substrate showing the third case in the manufacturing method of the electronic paper display substrate according to embodiment 3 of the present disclosure. The third case may be freely combined with the first case or the second case. Herein, the case of equipotential conductive thin film 18 and insulating layer thin film 16 are formed on the substrate 1 in the second case will be taken as an example. As shown in FIGS. 3D and 3E, the step 402 may comprise:

Step 701: coating a photoresist on a transparent conductive thin film 14;

Step 702: performing exposure and developing on the photoresist by patterning process using single-tone mask plate to form a photoresist completely remained region and a photoresist completely removed region, wherein the photoresist completely remained region corresponds to a color pixel electrode region and the photoresist completely removed region corresponds to the region other than the color pixel electrode region;

Step 703: removing the transparent conductive thin film 14 and the colored conductive thin film 151 corresponding to the photoresist completely removed region by etching to faun a pattern including the color pixel electrode 111. If both of the transparent conductive thin film and the colored conductive thin film are metals or metal oxides, the transparent conductive thin film and the colored conductive thin film corresponding to the photoresist completely removed region may be sequentially etched away by wet etching method so as to form the color pixel electrode.

Step 704: removing the insulating layer thin film 16 corresponding to the photoresist completely removed region by etching to form an insulating layer 17. The insulating layer thin film may be etched by dry etching method.

Step 705: removing the remained photoresist by ashing.

Embodiment 4

Figure 4A:
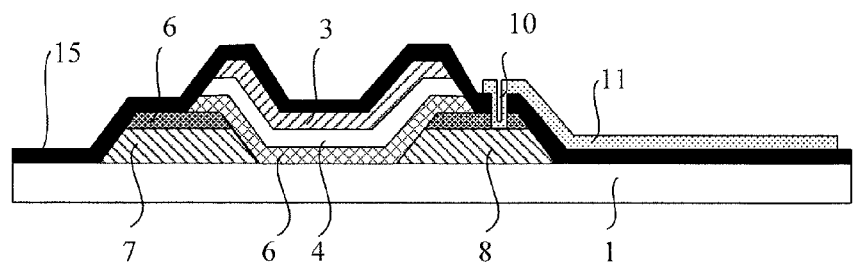
FIG. 4A is a schematic view of the electronic paper display substrate formed through the manufacturing method of the electronic paper display substrate according to embodiment 4 of the present disclosure.

FIG. 4A is a schematic view of the electronic paper display substrate formed through the manufacturing method of the electronic paper display substrate according to embodiment 4 of the present disclosure. As shown in FIG. 4A, the manufacturing method of the electronic paper display substrate may comprise a step of forming a gate line, a data line and a gate electrode 3, a source electrode 7, a drain electrode 8 and an active layer 6 of a thin film transistor on a base substrate 1. A pixel unit is formed to be surrounded by the data line and the gate line, the pixel unit each comprises a thin film transistor and a pixel electrode 11, the gate electrode 3 connects with the gate line, the source electrode 7 connects with the data line, the drain electrode 8 connects with the pixel electrode 11 (through a pixel electrode via 10), and the active layer 6 is formed between the source and drain electrodes 7 and 8 and the gate electrode 3 (a gate insulating layer 4 may be formed between the gate electrode 3 and the active layer 6). The manufacturing method of the electronic paper display substrate may further comprise a step of forming a colored layer 15 on the base substrate.

In one case, the electronic paper display substrate has a top-gate structure. Referring to FIG. 4A, the gate electrode 3 of the electronic paper display substrate is positioned on the source electrode 7 and the drain electrode 8. A gate electrode protection layer is positioned on the gate electrode. The gate electrode protection may be the colored layer 15. In the manufacturing method of the electronic paper display substrate according to embodiment 4 of the present disclosure, the step of forming the colored layer 15 and the pixel electrode 11 may comprises:

Step 801: forming a colored layer thin film on the base substrate formed with the gate line, the data line and the thin film transistor;

Step 802: forming a transparent conductive thin film on the colored layer thin film;

Step 803: coating a photoresist on the transparent conductive thin film;

Step 804: performing exposure and developing on the photoresist by patterning process using single-tone mask plate to form a photoresist completely remained region and a photoresist completely removed region, wherein the photoresist completely remained region corresponds to a pixel electrode region and the photoresist completely removed region corresponds to region other than the pixel electrode region;

Step 805: removing the transparent conductive thin film corresponding to the photoresist completely removed region by etching to form a pattern including the pixel electrode;

Step 806: removing the remained photoresist by ashing.

Figure 4B:
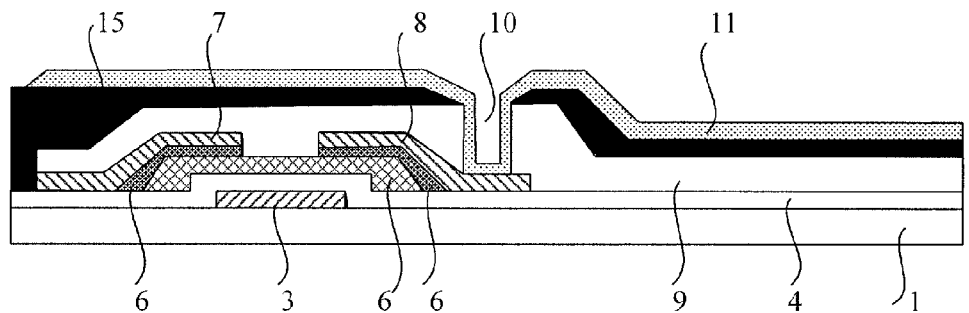
FIG. 4B is another schematic view of the electronic paper display substrate formed through the manufacturing method of the electronic paper display substrate according to embodiment 4 of the present disclosure.

In another case, the electronic paper display substrate has a bottom-gate structure. FIG. 4B is another schematic view of the electronic paper display substrate formed through the manufacturing method of the electronic paper display substrate according to embodiment 4 of the present disclosure. The gate electrode 3 is positioned under the source electrode 7 and the drain electrode 8. A passivation layer 9 is formed on the source electrode 7 and the drain electrode 8. The colored layer 15 and the pixel electrode 11 are formed on the passivation layer 9. The drain electrode 8 connects with the pixel electrode 11 through the pixel electrode via 10. In the manufacturing method of the electronic paper display substrate according to embodiment 4 of the present disclosure, the step of forming the colored layer and the pixel electrode by patterning process may comprise:

Step 901: forming a colored layer thin film on the base substrate formed with the gate line, the data line, the thin film transistor and the passivation layer;

Step 902: coating a photoresist on the colored layer thin film;

Step 903: performing exposure and developing on the photoresist by patterning process using single-tone mask plate to form a photoresist completely remained region and a photoresist completely removed region, wherein the photoresist completely remained region corresponds to a pixel electrode via region and the photoresist completely removed region corresponds to region other than the pixel electrode via region;

Step 904: removing the colored layer thin film and the passivation layer corresponding to the photoresist completely removed region by etching to form a pattern including the pixel electrode via;

Step 905: removing the remained photoresist by ashing;

Step 906: forming the pixel electrode on the base substrate formed with the pixel electrode via and the colored layer.

Figure 4C:
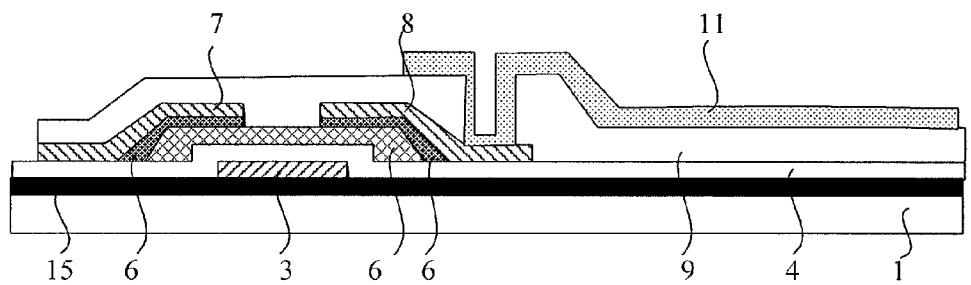
FIG. 4C is still another schematic view of the electronic paper display substrate formed through the manufacturing method of the electronic paper display substrate according to embodiment 4 of the present disclosure.

In still another case, the colored layer 15 can be directly disposed on the base substrate 1. FIG. 4C is still another schematic view of the electronic paper display substrate formed through the manufacturing method of the electronic paper display substrate according to embodiment 4 of the present disclosure. As shown in FIG. 4C, in the manufacturing method of the electronic paper display substrate, the step of forming colored layer 15, gate line, data line, thin film transistor (gate electrode 3, source electrode 7, drain electrode 8 and active layer 6 and so on) and pixel electrode 11 on the base substrate comprises:

Step 1001: forming a colored layer thin film as the colored layer 15 on the base substrate 1;

Step 1002: forming the data line, the gate line, the thin film transistor and the pixel electrode on the colored layer thin film. In addition, insulating patterns, such as the gate insulating layer 4, the passivation layer 9 and so on, are formed on the base substrate 1.

Figure 4D:
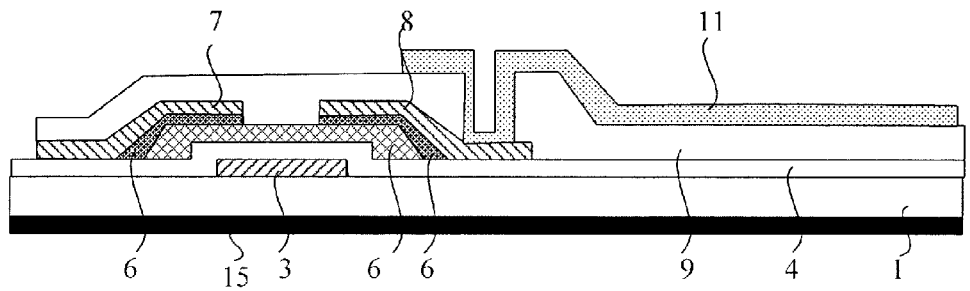
FIG. 4D is still another schematic view of the electronic paper display substrate formed through the manufacturing method of the electronic paper display substrate according to embodiment 4 of the present disclosure.

In still another case, the colored layer 15 may be disposed on the bottom of the base substrate 1. FIG. 4D is still another schematic view of the electronic paper display substrate formed through the manufacturing method of the electronic paper display substrate according to embodiment 4 of the present disclosure. In the manufacturing method of the electronic paper display substrate, the step of forming colored layer, gate line, data line, thin film transistor and pixel electrode comprises: forming a colored layer thin film as the colored layer 15 on a surface of the base substrate on which the gate line, the data line, the thin film transistor and the pixel electrode are not disposed.

According to the present embodiment, the colored layer is formed on the electronic paper display substrate. When controlling display through the thin film transistor, pattern displayed in region where the pixel electrode is disposed is the color of the colored layer. Compared with the transparent color, the color of the colored layer can make the contrast of the pixel region to the non-pixel region high and display colorful pattern. In addition, the equipotential conductive thin film of the electronic paper display substrate can form the same potential with the common electrode of the upper substrate so as to weaken the interference to the display medium on the non-pixel region by the fringe field between the common electrode and the pixel electrode and to improve the display quality.

Embodiment 5

Embodiment 5 of the present disclosure provides an electronic paper display substrate. As shown in FIG. 1B, the electronic paper display substrate comprises a base substrate 1, a pixel electrode 11 formed on the base substrate 1. The base substrate 1 further comprises a colored layer 15 corresponding to the pattern of the pixel electrode 11.

According to the present embodiment, by forming a corresponding colored layer under the pixel electrode having a predetermined pattern of the electronic paper display substrate, when electrifying and displaying, pattern displayed in the region where the pixel electrode and the colored layer are disposed has the color of the colored layer. Compared with the transparent color, the color of the colored layer can make the contrast of the pixel region to the non-pixel region high and display colorful pattern.

Embodiment 6

Embodiment 6 of the present disclosure provides an electronic paper display substrate. As shown in FIG. 2B, the electronic paper display substrate comprises a base substrate 1, a pixel electrode 11 formed on the base substrate 1. The base substrate 1 further comprises a colored layer 15 corresponding to the pattern of the pixel electrode 11.

Furthermore, an equipotential conductive thin film 18 covering the entire base substrate is formed under the colored layer 15. The material of the equipotential conductive thin film 18 may be transparent conductive material or opaque conductive material.

The material of the colored layer 15 can be chosen depending on the particular application situation, and comprises but not limited to the following two cases:

In the first case, the material of the colored layer 15 may be colored insulating material, such as black resin material.

If the material of the colored layer 15 is colored insulating material, the colored layer 15 may be directly formed on the base substrate 1. Since the colored insulating material has insulating property, if the equipotential conductive thin film 18 is formed on the base substrate 1, the colored layer 15 of the colored insulating material may be directly formed on the equipotential conductive thin film 18, as shown in FIG. 2B.

In the second case, the material of the colored layer may be colored conductive material.

If the material of the colored layer is colored conductive material, the colored layer may be directly formed on the base substrate. Since the colored conductive material has conductive property, if the equipotential conductive thin film is formed on the base substrate, in order to prevent the pixel electrode from electrically connecting with the equipotential conductive thin film, an insulating layer is formed between the conductive colored layer and the equipotential conductive thin film. The colored layer and the pixel electrode constitute the color pixel electrode together, as shown in FIG. 3E.

The color of the colored layer of the present embodiment may be referred to the related description in the embodiment 1.

The pixel electrode may be a pixel electrode having a predetermined pattern.

According to the present embodiment, the corresponding colored layer is formed under the pixel electrode of the electronic paper display substrate, when electrifying and displaying, pattern displayed in region where the pixel electrode and the colored layer are disposed has the color of the colored layer. Compared with the transparent color, the color of the colored layer can make the contrast of the pixel region to the non-pixel region high and display colorful pattern. The equipotential conductive thin film of the electronic paper display substrate can form the same potential with the common electrode of the upper substrate so as to weaken the interference to the display medium on the non-pixel region by the fringe field between the common electrode and the pixel electrode and to improve the display quality.

Embodiment 7

The electronic paper display substrate according to embodiment 7 may further comprise TFT device based on the above described embodiment 5 and embodiment 6. As shown in FIG. 4A, the electronic paper display substrate has the following structure: a data line and a gate line crossing with each other are formed on the base substrate 1, and a pixel unit is formed to be surrounded by the data line and the gate line; each pixel electrode comprises a thin film transistor and a pixel electrode; the thin film transistor comprises a gate electrode 3, a source electrode 7, a drain electrode 8 and an active layer 6; the gate electrode 3 connects with the gate line, the source electrode 5 connects with the data line, the drain electrode 6 connects with the pixel electrode 11 (they may be connected through a pixel electrode via 10 or directly lapping-connected), the active layer 6 is formed between the source and drain electrodes 7 and 8 and the gate electrode 4. In addition, a gate insulating layer 4 is formed between the gate electrode and the active layer 6.

In one case, if the electronic paper display substrate has a top-gate structure, referring to FIG. 4A, the gate electrode 3 is positioned on the source electrode 7 and the drain electrode 8. A gate electrode protection layer is positioned on the gate electrode 3 and under the pixel electrode, and the gate electrode protection is the colored layer 15.

In another case, if the electronic paper display substrate has a bottom-gate structure, referring to FIG. 4B, the gate electrode 3 is positioned under the source electrode 7 and the drain electrode 8. A passivation layer 9 is formed on the source electrode 7 and the drain electrode 8. The pixel electrode 11 is formed on the passivation layer 9. The drain electrode 8 connects with the pixel electrode 11 through the pixel electrode via 10. The colored layer 15 is positioned between the pixel electrode 11 and the passivation layer 9.

In still another case, referring to FIG. 4C, the colored layer 15 may be positioned on the base substrate 1, and the data line, the gate line, the thin film transistor (comprising the gate electrode 3, the source electrode 7, the drain electrode 8, the active layer 6 and so on), and the pixel electrode 11 are formed on the colored layer 15.

In still another case, referring to FIG. 4D, one surface of the base substrate 1 is formed with the colored layer 15, and another surface of the base substrate 1 is formed with the data line, the gate line, the thin film transistor (comprising the gate electrode 3, the source electrode 7, the drain electrode 8, the active layer 6 and so on), and the pixel electrode 11.

In embodiments of the present disclosure, the colored layer may be color resin matrix including red, green and blue color filters, each color filter corresponds to one pixel electrode, referring to FIG. 1C.

Embodiment 8

Embodiment 8 of the present disclosure provides an electronic paper display substrate. Referring to FIG. 3A, the electronic paper display substrate comprises the base substrate 1. The color pixel electrode 111 is formed on the base substrate 1.

Furthermore, referring to FIG. 3C, an equipotential conductive thin film 18 covering the entire base substrate is formed under the color pixel electrode 111. An insulating layer 17 corresponding to the color pixel electrode 111 is formed between the color pixel electrode 111 and the equipotential conductive thin film 18.

Embodiment 9

Figure 5:
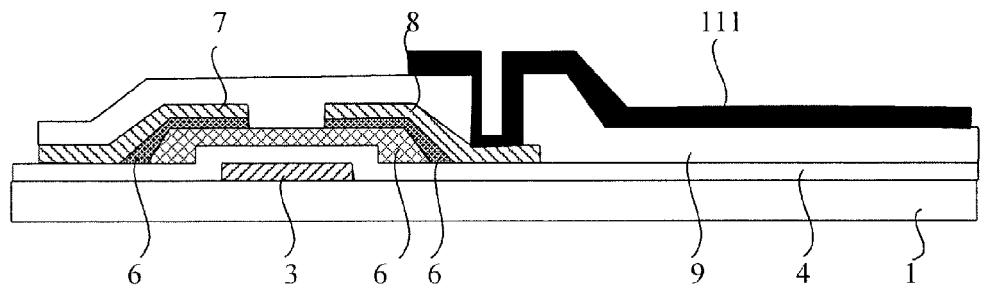
FIG. 5 is a schematic structural view of an electronic paper display substrate according to embodiment 9 of the present disclosure.

FIG. 5 is a schematic structural view of an electronic paper display substrate according to embodiment 9 of the present disclosure. As shown in FIG. 5, the electronic paper display substrate according to embodiment 9 may comprise TFT device based on embodiment 8. A data line and a gate line (not shown) crossing with each other are formed on the base substrate 1, a pixel unit is formed to be surrounded by the data line and the gate line; each pixel electrode comprises a thin film transistor and a color pixel electrode; the thin film transistor comprises a gate electrode 3, a source electrode 7, a drain electrode 8 and an active layer 6; the gate electrode 3 connects with the gate line, the source electrode 7 connects with the data line, the drain electrode 8 connects with the color pixel electrode 111, and the active layer 6 is formed between the source and drain electrodes 7 and 8 and the gate electrode 3. A gate insulating layer 4 is formed between the gate electrode 3 and the active layer 6. A passivation layer 9 is formed between the drain electrode 8 and the color pixel electrode 111. The drain electrode 8 connects with the color pixel electrode 111 through a pixel electrode via 10 on the passivation layer 9.

Embodiment 10

Embodiment 10 of the present disclosure provides an electronic paper display, comprising an upper substrate and a lower substrate cell assembled together, wherein a transparent conductive thin film is formed on a surface of the upper substrate facing the lower substrate, and the lower substrate is the electronic paper display substrate having any structure described in the above embodiments. Display medium is interposed between the upper substrate and the lower substrate.

For example, referring to FIGS. 3D and 3E, after depositing an equipotential conductive thin film 18, an insulating layer thin film 16, a colored conductive thin film 151 (such as black metal Cr), and transparent conductive thin film 14 (such as ITO) on the base substrate 1, the transparent conductive thin film 14, the colored conductive thin film 151, the insulating layer thin film 16 may be etched by using one mask to form a color pixel electrode 111 and an insulating layer 17 having a predetermined pattern, and the upper and lower substrates are assembled to form the electronic paper display. Then, display medium may be injected by using physical siphon phenomenon. Finally, through photo polymerization under certain preparation temperature and ultraviolet ray intensity, the desired electronic paper display is obtained. Since the electro chromism material can achieve bi-stable state and need low driving voltage; polymer dispersed liquid crystal film does not need polarization sheet, rubbing alignment is not needed and large size flexible display is possible, thus the process is greatly simplified and the luminance and performance of the display is improved. Therefore, the display medium in the electronic paper display of the embodiment of the present disclosure preferably may be electro chromism material or polymer dispersed liquid crystal material.

Figure 6A:
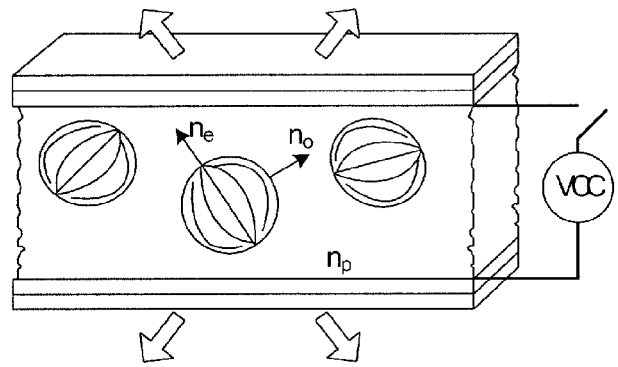
FIG. 6A is a schematic view of the PDLC film in a dispersed state.
Figure 6B:
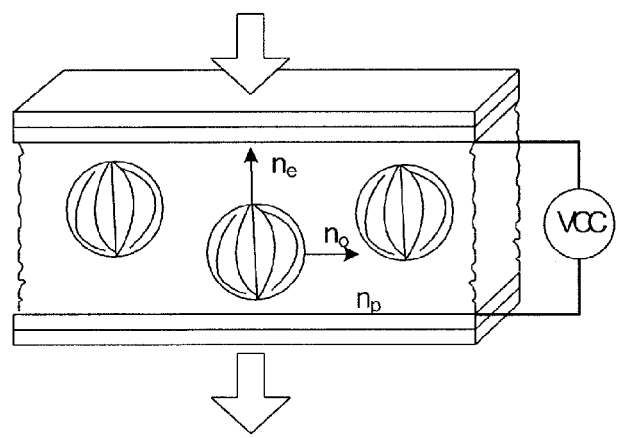
FIG. 6B is a schematic view of the PDLC film in a transmission state.

The polymer dispersed liquid crystal material is taken as an example to explain the display principle of the electronic paper display of the embodiments of the present disclosure. FIG. 6A is a schematic view of the PDLC film in a dispersed state. As shown in FIG. 6A, when power source VCC is turned off, no electric field is applied to the PDLC film. When incident light enters into the PDLC film, the difference between the effective refractivity of the liquid crystal droplet and the refractivity $n_p$ of the polymer is larger. The incident light is reflected and refracted many times on the interface between the liquid crystal of the PDLC film and the polymer. The PDLC film presents a dispersion state. FIG. 6B is a schematic view of the PDLC film in a transmission state. As shown in FIG. 6B, the power source VCC is turned on to apply electric field on the PDLC film. The director of the liquid crystal droplet aligns along the electric field. If the refractivity $n_0$ of the employed display medium matches with the refractivity $n_p$ of the polymer, the incident light does not reflect in the PDLC film but rather transmit directly, and the PDLC film presents transparent state.

Data signal and common electrode signal may be lead out at periphery of the lower substrate. The data signal controls the magnitude of the voltage of the pixel electrode and the shading state of the display device. The common electrode signal controls the voltage of the common electrode on the upper substrate and the voltage of the equipotential conductive thin film of the lower substrate, wherein the common electrode is electrically connected to the equipotential conductive thin film. The common electrode may be grounded. Voltage of the data signal may be direct current, or alternate current applied in an alternate current manner of equal magnitude and inverse polarity. When a voltage is applied on the data signal, electric filed is applied to the PDLC film corresponding to pixel region where the pixel electrode is disposed. The liquid crystal molecules of the PDLC film corresponding to the pixel region align along a direction perpendicular to the direction of the electric filed. Light can pass through the PDLC film and ITO and be absorbed by the colored layer under the ITO, and presents a certain color, such as the same color as that of the colored layer, such as black, red, green or multicolor and so on. As for other non-pixel regions, since the upper substrate and the lower substrate are both applied with the voltage of the common electrode signal, the PDLC film of the non-pixel region is not applied with electric field, and the liquid crystal molecules of the PDLC film in the non-pixel region is still in a state of randomly distribution. Thus, the non-pixel region presents a milk white dispersion state. At this time, the contrast of the pixel region to the non-pixel region is high and colorful pattern can be displayed. When the voltage of the data signal is removed, the liquid crystal molecules of the PDLC in the pixel region return to the state of randomly distribution, thus the image of the entire electronic paper display presents milk white dispersion state.

According to the present embodiment, the color pixel electrode is formed on the lower substrate of the electronic paper display. When electrifying and displaying, pattern displayed in region where the pixel electrode is disposed has the color of the colored layer. Compared with the transparent color, the color of the colored layer can make the contrast of the pixel region to the non-pixel region high and display colorful pattern. The equipotential conductive thin film of the lower substrate can form the same potential with the common electrode of the upper substrate, so as to weaken the interference to the display medium on the non-pixel region by the fringe field between the common electrode and the pixel electrode and to improve the display quality.

The manufacturing method of the electronic paper display substrate may be used to produce the electronic paper display substrate provided by the embodiments of the present disclosure. The manufacturing method of the electronic paper display substrate comprises steps of forming the corresponding structure of the electronic paper display substrate.

It should be explained finally that the above embodiments are only used to explain the technical solution of the disclosed technology, and it is not intended to limit the technical solution of the disclosed technology. Although the disclosed technology is described in detail with reference to the forgoing embodiments, those with ordinary skills in the art should understand: they still may make modifications to the technical solution described by the foregoing embodiments, or make equivalent substitution to some of the technical features. All such modifications or substitutions will not make the nature of the corresponding technical solution depart from the spirit and scope of the technical solution of various embodiments of the disclosed technology.

What is claimed is:

1. A manufacturing method of an electronic paper display substrate, comprising:
    forming a color pixel electrode having a predetermined pattern on a base substrate, and
    forming an equipotential conductive thin film on the base substrate, wherein the equipotential conductive thin film has a potential equal to that of a common electrode provided on a substrate facing to the electronic paper display substrate, and the equipotential conductive thin film is insulated from the color pixel electrode,
    wherein a color of the color pixel electrode is not changed by an electric field applied to the electronic paper display.

2. The manufacturing method according to claim 1, wherein the step of
    forming a color pixel electrode having a predetermined pattern on the base substrate comprises:
    forming a colored layer thin film and a transparent conductive thin film on the base substrate; and
    patterning the transparent conductive thin film and the colored layer thin film to form a pixel electrode and a colored layer having a predetermined pattern.

3. The manufacturing method according to claim 2, wherein the step of forming the colored layer thin film and the transparent conductive thin film on the base substrate comprises:
    forming the equipotential conductive thin film covering the entire base substrate;
    forming a colored insulating layer thin film as the colored layer thin film on the equipotential conductive thin film; and
    forming the transparent conductive thin film on the colored insulating layer thin film.

4. The manufacturing method according to claim 1, wherein the step of forming a color pixel electrode having a predetermined pattern on the base substrate comprises:
    forming a colored conductive thin film on the base substrate; and
    patterning the colored conductive thin film to form the color pixel electrode having a predetermined pattern.

5. The manufacturing method according to claim 4, before forming the colored conductive thin film, further comprising:
    sequentially forming the equipotential conductive thin film and an insulating layer thin film on the base substrate.

6. The manufacturing method according to claim 4, after forming the colored conductive thin film on the base substrate, further comprising:
    forming a transparent conductive thin film.

7. The manufacturing method according to claim 6, wherein, the step of forming the color pixel electrode having a predetermined pattern comprises: patterning the stack of the colored conductive thin film and the transparent conductive thin film.

8. A manufacturing method of an electronic paper display substrate, comprising:
    forming a gate line, a data line and a gate electrode, a source electrode, a drain electrode and an active layer of a thin film transistor on a base substrate,
    wherein a pixel unit is formed to be surrounded by the data line and the gate line, the pixel unit each comprises a thin film transistor and a pixel electrode, the gate electrode connects with the gate line, the source electrode connects with the data line, the drain electrode connects with the pixel electrode, and the active layer is formed between the source and drain electrodes and the gate electrode;
    forming a colored layer on the base substrate; and
    forming an equipotential conductive thin film on the base substrate, wherein the equipotential conductive thin film has a potential equal to that of a common electrode provided on a substrate facing to the electronic paper display substrate, and the equipotential conductive thin film is insulated from the pixel electrode,
    wherein a color of the colored layer is not changed by an electric field applied to the electronic paper display.

9. The manufacturing method according to claim 8, wherein the gate electrode is positioned on the source electrode and the drain electrode, a gate electrode protection layer is positioned on the gate electrode, the gate electrode protection layer is a colored layer, and the pixel electrode is formed on the colored layer.

10. The manufacturing method according to claim 8, wherein the gate electrode is positioned under the source electrode and the drain electrode, a passivation layer is formed on the source electrode and the drain electrode, a colored layer and the pixel electrode are sequentially formed on the passivation layer, the drain electrode connects with the pixel electrode through a pixel electrode via formed in the colored layer and the passivation layer.

11. The manufacturing method according to claim 8, wherein the step of
    forming the colored layer, the gate line, the data line, the thin film transistor and the pixel electrode on the lower base substrate comprises:
    forming a colored layer thin film as the colored layer on the base substrate; and
    forming the data line, the gate line, the thin film transistor and the pixel electrode on the colored layer thin film, or forming a colored layer thin film as the colored layer on a surface of the base substrate on which the gate line, the data line, the thin film transistor and the pixel electrode are not disposed.

12. An electronic paper display substrate, comprising:
    a base substrate,
    a pixel electrode formed on the base substrate,
    a colored layer corresponding to the pixel electrode; and
    an equipotential conductive thin film formed on the base substrate, wherein the equipotential conductive thin film has a potential equal to that of a common electrode provided on a substrate facing to the electronic paper display substrate, and the equipotential conductive thin film is insulated from the pixel electrode,
    wherein a color of the colored layer is not changed by an electric field applied to the electronic paper display.

13. The electronic paper display substrate according to claim 12, wherein:
    the colored layer is formed of a colored insulating material, and the equipotential conductive thin film covers the entire base substrate and is formed under the colored layer.

14. The electronic paper display substrate according to claim 12, wherein a data line and a gate line crossing with each other are formed on the base substrate, a pixel unit is formed to be surrounded by the data line and the gate line; the pixel unit comprises a thin film transistor and the pixel electrode; the thin film transistor comprises a gate electrode, a source electrode, a drain electrode and an active layer; the gate electrode connects with the gate line, the source electrode connects with the data line, the drain electrode connects with the pixel electrode, and the active layer is formed between the source and drain electrodes and the gate electrode.

15. The electronic paper display substrate according to claim 14, wherein the gate electrode is positioned on the source electrode and the drain electrode, a gate electrode protection layer is positioned on the gate electrode and under the pixel electrode, and the gate electrode protection layer is a colored layer.

16. The electronic paper display substrate according to claim 14, wherein the gate electrode is positioned under the source electrode and the drain electrode, a passivation layer is formed on the source electrode and the drain electrode, the pixel electrode is formed on the passivation layer, the drain electrode connects with the pixel electrode through a pixel electrode via, and the colored layer is positioned between the pixel electrode and the passivation layer.

17. The electronic paper display substrate according to claim 14, wherein the colored layer is positioned one surface of on the base substrate, and wherein the data line, the gate line, the thin film transistor and the pixel electrode are formed on the colored layer, or the other surface of the base substrate is formed with the data line, the gate line, the thin film transistor and the pixel electrode.

18. The electronic paper display substrate according to claim 14, wherein the colored layer comprises a colored resin matrix comprising red, green and blue color filters, and each color filter corresponds to one pixel electrode.

19. The electronic paper display substrate according to claim 12, wherein the pixel electrode and the colored layer are formed integratedly with a colored conductive thin film to obtain a color pixel electrode.

20. The electronic paper display substrate according to claim 19, wherein the equipotential conductive thin film covers the entire base substrate and is formed under the color pixel electrode, and an insulating layer corresponding to the color pixel electrode is formed between the color pixel electrode and the equipotential conductive thin film.

* * * * *